under 35 U.S.C. 154(b) by 0 days.

United States Patent
Chen et al.

(10) Patent No.: US 10,522,481 B2
(45) Date of Patent: *Dec. 31, 2019

(54) POST-PASSIVATION INTERCONNECT STRUCTURE

(71) Applicant: Taiwan Semiconductor Manufacturing Company, Ltd., Hsinchu (TW)

(72) Inventors: Hsien-Wei Chen, Hsinchu (TW); Hao-Yi Tsai, Hsinchu (TW); Mirng-Ji Lii, Hsinchu County (TW); Chen-Hua Yu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/181,130

(22) Filed: Nov. 5, 2018

(65) Prior Publication Data

US 2019/0074255 A1 Mar. 7, 2019

Related U.S. Application Data

(63) Continuation of application No. 15/477,717, filed on Apr. 3, 2017, now Pat. No. 10,121,749, which is a (Continued)

(51) Int. Cl.
*H01L 23/31* (2006.01)
*H01L 23/00* (2006.01)
(Continued)

(52) U.S. Cl.
CPC ........ *H01L 23/562* (2013.01); *H01L 23/3114* (2013.01); *H01L 23/3192* (2013.01);
(Continued)

(58) Field of Classification Search
CPC ..................................................... H01L 23/31
See application file for complete search history.

(56) References Cited

U.S. PATENT DOCUMENTS 5,466,635 A  11/1995 Lynch et al.
6,218,281 B1  4/2001 Watanabe et al.
(Continued)

FOREIGN PATENT DOCUMENTS

JP  5335313  12/1993
JP  2000228420  8/2000

*Primary Examiner* — Thao X Le
*Assistant Examiner* — Geoffrey H Ida
(74) *Attorney, Agent, or Firm* — Haynes and Boone, LLP

(57) ABSTRACT

A semiconductor device includes a semiconductor substrate, a passivation layer overlying the semiconductor substrate, and an interconnect structure overlying the passivation layer. The interconnect structure includes a landing pad region and a dummy region electrically separated from each other. A protective layer is formed on the interconnect structure and has a first opening exposing a portion of the landing pad region and a second opening exposing a portion of the dummy region. A metal layer is formed on the exposed portion of landing pad region and the exposed portion of the dummy region. A bump is formed on the metal layer overlying the landing pad region.

20 Claims, 8 Drawing Sheets

Related U.S. Application Data continuation of application No. 13/313,811, filed on Dec. 7, 2011, now Pat. No. 9,613,914.

(51) Int. Cl.
*H01L 23/522* (2006.01)
*H01L 23/525* (2006.01)

(52) U.S. Cl.
CPC .......... *H01L 23/522* (2013.01); *H01L 23/525* (2013.01); *H01L 24/05* (2013.01); *H01L 24/13* (2013.01); *H01L 2224/02235* (2013.01); *H01L 2224/02255* (2013.01); *H01L 2224/02375* (2013.01); *H01L 2224/02377* (2013.01); *H01L 2224/0401* (2013.01); *H01L 2224/05008* (2013.01); *H01L 2224/05022* (2013.01); *H01L 2224/05027* (2013.01); *H01L 2224/05124* (2013.01); *H01L 2224/05147* (2013.01); *H01L 2224/05166* (2013.01); *H01L 2224/05181* (2013.01); *H01L 2224/05186* (2013.01); *H01L 2224/05552* (2013.01); *H01L 2224/05572* (2013.01); *H01L 2224/05647* (2013.01); *H01L 2224/05655* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2924/00014* (2013.01); *H01L 2924/01079* (2013.01); *H01L 2924/12042* (2013.01)

(56) References Cited

U.S. PATENT DOCUMENTS

| | | | |
|---|---|---|---|
| 6,229,220 B1 | 5/2001 | Saitoh et al. | |
| 6,399,478 B2 | 6/2002 | Matsubara et al. | |
| 6,423,566 B1 | 7/2002 | Feger et al. | |
| 6,429,060 B1 | 8/2002 | Itoh et al. | |
| 6,500,750 B1 | 12/2002 | Shroff et al. | |
| 6,578,754 B1 | 6/2003 | Tung | |
| 6,592,019 B2 | 7/2003 | Tung | |
| 6,818,545 B2 | 11/2004 | Lee et al. | |
| 6,853,076 B2 | 2/2005 | Datta et al. | |
| 6,917,119 B2 | 7/2005 | Lee et al. | |
| 7,064,436 B2 | 6/2006 | Ishiguri et al. | |
| 7,391,112 B2 | 6/2008 | Li et al. | |
| 7,582,556 B2 | 9/2009 | Lin et al. | |
| 9,613,914 B2 * | 4/2017 | Chen | H01L 23/3114 |
| 10,121,749 B2 * | 11/2018 | Chen | H01L 23/3114 |
| 2002/0185733 A1 | 12/2002 | Chow et al. | |
| 2005/0266667 A1 | 12/2005 | Huang | |
| 2006/0145347 A1 | 7/2006 | Aida et al. | |
| 2006/0292851 A1 | 12/2006 | Lin et al. | |
| 2007/0232051 A1 | 10/2007 | Wang et al. | |
| 2008/0138624 A1 | 6/2008 | Lewis et al. | |
| 2010/0041234 A1 | 2/2010 | Weigel et al. | |
| 2010/0090318 A1 | 4/2010 | Hsu et al. | |
| 2010/0295138 A1 | 11/2010 | Montanya Silvestre et al. | |
| 2011/0049705 A1 | 3/2011 | Liu et al. | |
| 2011/0079922 A1 | 4/2011 | Yu et al. | |

\* cited by examiner

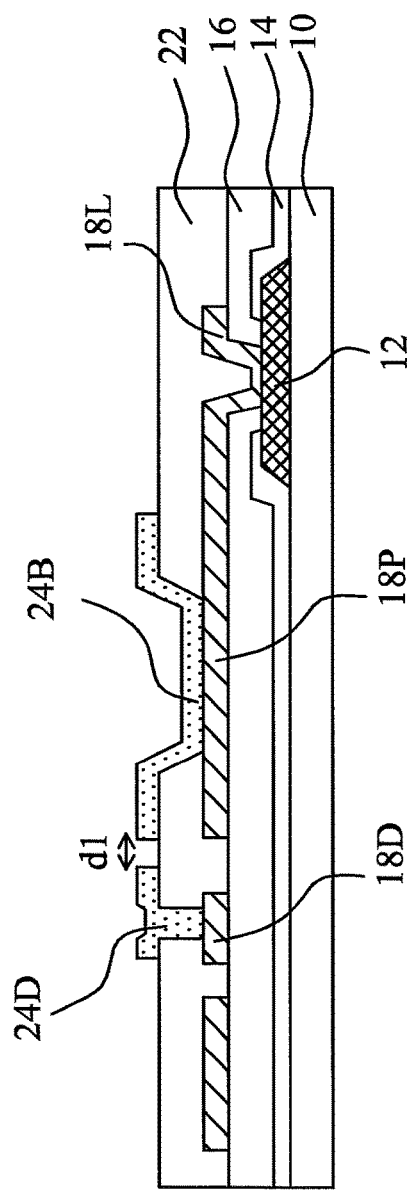
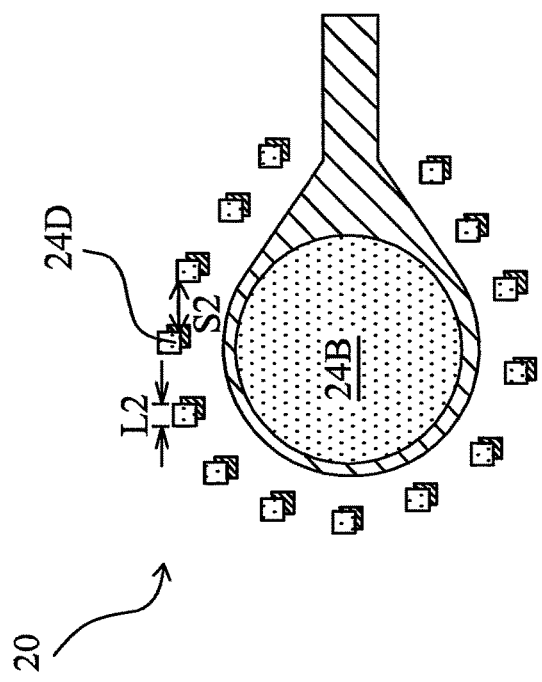
Fig. 3A
Fig. 3B

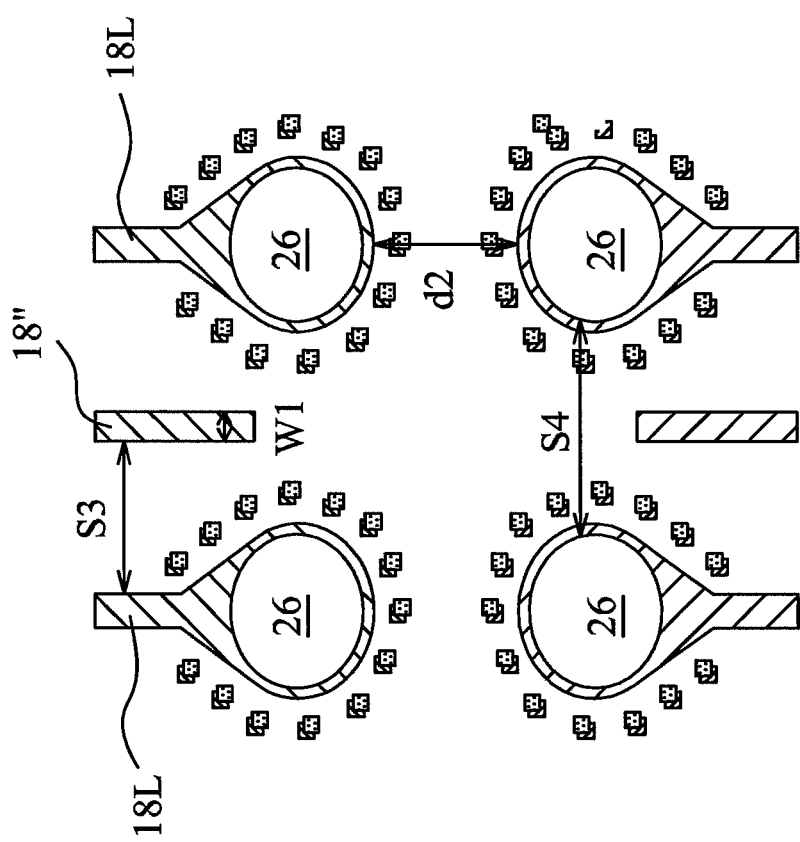

POST-PASSIVATION INTERCONNECT STRUCTURE

CROSS-REFERENCE TO RELATED APPLICATION

The present application is a continuation application of U.S. patent application Ser. No. 15/477,717, filed Apr. 3, 2017, entitled "METHOD OF FABRICATING A POST-PASSIVATION INTERCONNECT STRUCTURE," issuing as U.S. Pat. No. 10,121,749, which is a continuation application of U.S. patent application Ser. No. 13/313,811, entitled "POST-PASSIVATION INTERCONNECT STRUCTURE," filed Dec. 7, 2011, now U.S. Pat. No. 9,613,914, which is related to co-pending U.S. filing Ser. No. 13/272,540 filed on Oct. 13, 2011, each of which is expressly incorporated by reference herein in their entirety.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as via openings and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package. Structurally, a bump actually contains the bump itself and an "under bump metallurgy" (UBM) located between the bump and an I/O pad.

Wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films and bumps. The known PPI formation processes, however, have polymer film peeling issues, which may induce weak interfaces at the PPI structure and cause failures in the device.

BRIEF DESCRIPTION OF THE DRAWINGS

FIGS. 1A, 2, 3A, 4A are cross-sectional views and FIGS. 1B, 3B and 4B are top views of illustrating various intermediate stages of a method of forming a semiconductor device having a PPI structure in accordance with an exemplary embodiment.

DETAILED DESCRIPTION

Figure 1A:
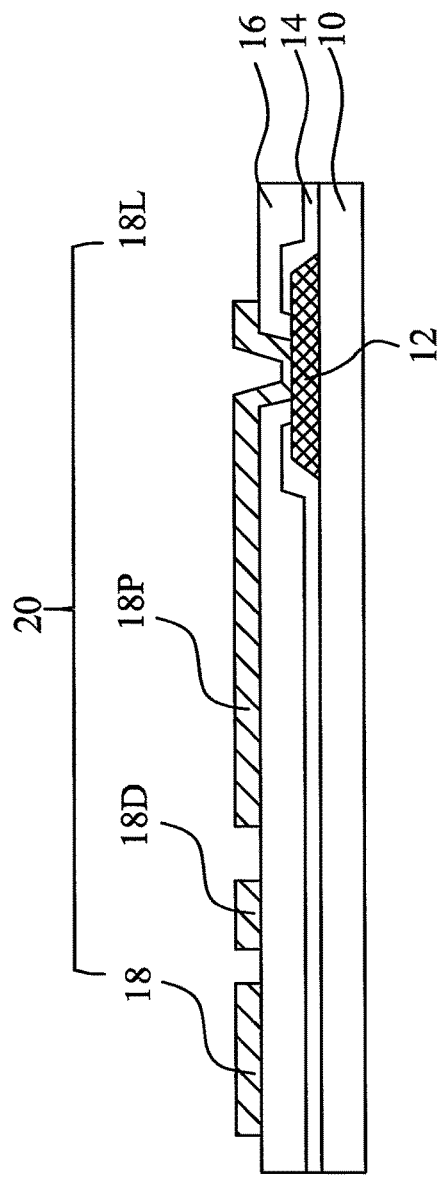

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed, in particular, to elements forming part of, or cooperating more directly with, an apparatus in accordance with the present disclosure. It is to be understood that elements not specifically shown or described may take various forms well known to those skilled in the art. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-4 illustrate various intermediate stages of a method of forming a PPI structure in a semiconductor device in accordance with an embodiment.

Referring first to FIG. 1, a portion of a substrate 10 having electrical circuitry formed thereon is shown in accordance with an embodiment. The substrate 10 may comprise, for example, bulk silicon wafer, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used.

Electrical circuitry formed on the substrate 10 may be any type of circuitry suitable for a particular application. In an embodiment, the electrical circuitry includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

One or more inter-metal dielectric (IMD) layers and the associated metallization layers are formed over and interconnect the electrical circuitry. The IMD layers may be formed of a low-K dielectric material, such as fluorinated silicate glass (FSG) formed by plasma-enhanced chemical vapor deposition (PECVD) techniques or high-density plasma CVD (HDPCVD), or the like, and may include intermediate etch stop layers. It should be noted that one or more etch stop layers (not shown) may be positioned between adjacent ones of the dielectric layers. Generally, the etch stop layers provide a mechanism to stop an etching process when forming via openings and/or contacts. The etch stop layers are formed of a dielectric material having a different etch selectivity from adjacent layers. In an embodiment, etch stop layers may be formed of SiN, SiCN, SiCO, CN, combinations thereof, or the like, deposited by CVD or PECVD techniques.

The metallization layers may be formed of copper or copper alloys, although they can also be formed of other metals. Further, the metallization layers include a top metal layer formed and patterned in or on the uppermost IMD layer to provide external electrical connections and to protect the underlying layers from various environmental contaminants. The uppermost IMD layer may be formed of a dielectric material, such as silicon nitride, silicon oxide, undoped silicon glass, and the like.

With reference to FIG. 1A, a conductive pad 12 is formed on the substrate 10 to electrically connect the underlying metal layer. The conductive pad 12 may be formed of aluminum, aluminum copper, aluminum alloys, copper, copper alloys, or the like. One or more passivation layers, such as passivation layer 14 are formed over the conductive pads 12 and the exposed substrate 10. The passivation layer 14 may be formed of a dielectric material, such as undoped silicate glass (USG), silicon nitride, silicon oxide, silicon oxynitride or a non-porous material by any suitable method, such as CVD, PVD, or the like. The passivation layer 14 may be a single layer or a laminated layer. It is noted that a single layer of conductive pad and a passivation layer are shown for illustrative purposes only. As such, other embodiments may include any number of conductive layers and/or passivation layers.

The passivation layer 14 is then patterned by the use of masking methods, lithography technologies, etching processes, or combinations thereof, such that an opening is formed to expose the a portion of conductive pad 12. In one embodiment, the passivation layer 14 is patterned to cover the peripheral portion of the conductive pad 12, and to expose the central portion of conductive pad 12.

Next, a first protective layer 16 is formed on the passivation layer 14, and then patterned to form another opening, through which at least a portion of the conductive pad 12 is exposed again. The first protective layer 16 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

Thereafter, a PPI structure 20 is formed and patterned on the first protective layer 16 and electrically connected to the conductive pad 12 through the opening of the first protective layer 16. The PPI structure 20 is a conductive layer 18 that includes an interconnect line region 18L, a landing pad region 18P and a dummy region 18D. The interconnect line region 18L, the landing pad region 18P and the dummy region 18D may be formed simultaneously, and may be formed of a same conductive material. A bump feature will be formed over and electrically connected to the landing pad region 18P in subsequent processes. The interconnect line region 18L electrically connects to the landing pad region 18P and extends to electrically connect the conductive pad 12 through the opening of the first protective layer 16. The dummy region 18D is electrically separated from the landing pad region 18P and the interconnect line region 18L. The conductive layer 18 may include, but is not limited to, for example copper, aluminum, copper alloy, or other mobile conductive materials using plating, electroless plating, sputtering, chemical vapor deposition methods, and the like. In some embodiments, the conductive layer may further include a nickel-containing layer or a silicon nitride layer (not shown) on top of a copper-containing layer. In some embodiments, the PPI structure 20 may also function as power lines, re-distribution lines (RDL), inductors, capacitors or any passive components. Through the routing of PPI structure 20, the landing pad region 18P may be, or may not be, directly over the conductive pad 12.

Figure 1B:
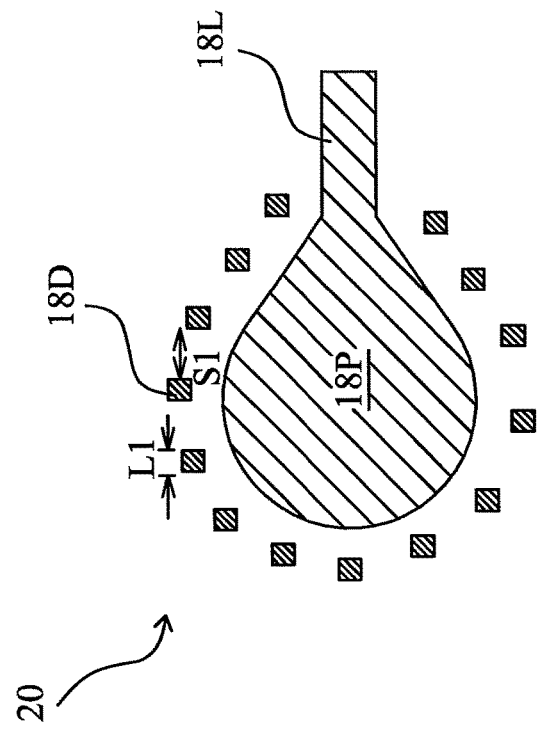

FIG. 1B is a top view of the PPI structure 20 in accordance with an exemplary embodiment. The PPI structure 20 includes at least one dummy region 18D adjacent to the landing pad region 18P. In some embodiments, a plurality of dummy regions 18D is formed on the first protective layer 16 adjacent to the landing pad region 18P. It should also be noted that the placement of the dummy regions 18D is provided for illustrative purposes only and that the specific locations and patterns of the dummy regions 18D may vary and may include, for example, square-shape regions, circle-shape regions, rectangular-shape regions, slots or the like. For example, dummy region 18D may be a square shape with a length L1 larger than 5 μm. In an embodiment, the space S1 between two adjacent dummy regions 18D is larger than 5 μm. The illustrated sizes are provided for reference only and are not intended to be actual sizes or actual relative sizes.

Figure 2:
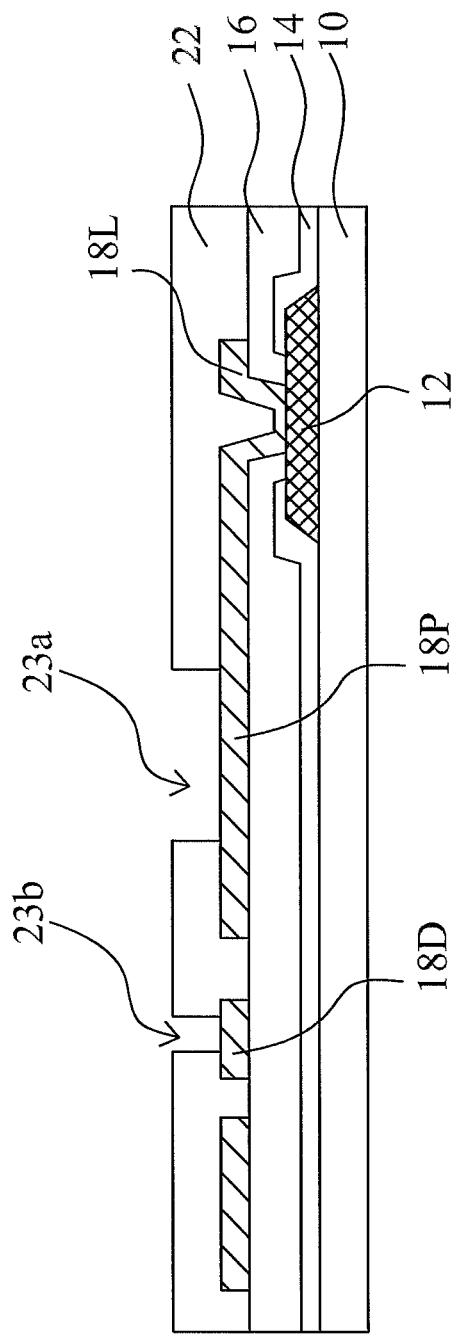

With reference to FIG. 2, a second protective layer 22 is then formed on the substrate 10 to cover the PPI structure 20 and the exposed portions of the first protective layer 16. Using photolithography and/or etching processes, the second protective layer 22 is further patterned to form a first opening 23a exposing a portion of the landing pad region 18P and a second opening 23b exposing a portion of at least one of the dummy region 18D. In an embodiment, a plurality of second openings 23b are formed in the second protective layer 22 to expose a plurality of dummy regions 18D, respectively. The formation methods of the openings 23a and 23b may include lithography, wet or dry etching, laser drill, and/or the like. In some embodiments, the second protective layer 22 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 22 is formed of a non-organic material selected from un-doped silicate glass (USG), silicon nitride, silicon oxynitride, silicon oxide, and combinations thereof.

Next, as shown in FIG. 3A, a metal layer 24 is deposited and patterned on the exposed portions of the landing pad region 18P and the dummy region 18D. On the landing pad region 18P, the patterned metal layer 24 formed in the first opening 23a covers the exposed portion of the landing pad region 18P to function as an under-bump-metallization (UBM) layer 24B on which a bump will be formed. On the dummy region 18D, the metal layer 24 fills the second opening 23b and physically connects the dummy region 18D to function as a dummy pillar 24D which is electrically separated from the UBM layer 24B. In some embodiments, the metal layer 24 includes a diffusion barrier layer or a glue layer, which may comprise titanium (Ti), tantalum (Ta), titanium nitride (TiN), tantalum nitride (TaN), or the like and be formed by PVD or sputtering. The metal layer 24 may further include a seed layer formed on the diffusion barrier layer by PVD or sputtering. The seed layer may be formed of copper (Cu) or copper alloys including Al, chromium (Cr), nickel (Ni), tin (Sn), gold (Ag), or combinations thereof. In at least one embodiment, the metal layer 24 includes a Ti layer and a Cu layer. In another embodiment, the metal layer 24 includes a Ti layer, a Cu layer and a Ni layer.

FIG. 3B is a top view of the patterned metal layer 24 in accordance with an exemplary embodiment. The patterned metal layer 24 includes at least one dummy pillar 24D adjacent to the UBM layer 24B. In some embodiments, a plurality of dummy pillars 24D is formed in the second protective layer 22 adjacent to the UBM layer 24B. It should also be noted that the placement of the dummy pillars 24D is provided for illustrative purposes only and that the specific locations and patterns of the dummy pillars 24D may vary and may include, for example, square shape pillars, circle-shape pillars, rectangular-shape pillars, or the like. For example, dummy pillar 24D may be a square shape with a length L2 larger than 5 μm. In an embodiment, the space S2 between two adjacent dummy pillars 24D is larger than 5 μm. The distance d1 between the dummy pillar 24D and the UBM layer 24B is greater than 10 μm or greater than 20 μm. The illustrated pillar sizes are provided for reference only and are not intended to be actual sizes or actual relative sizes.

Figure 4A:
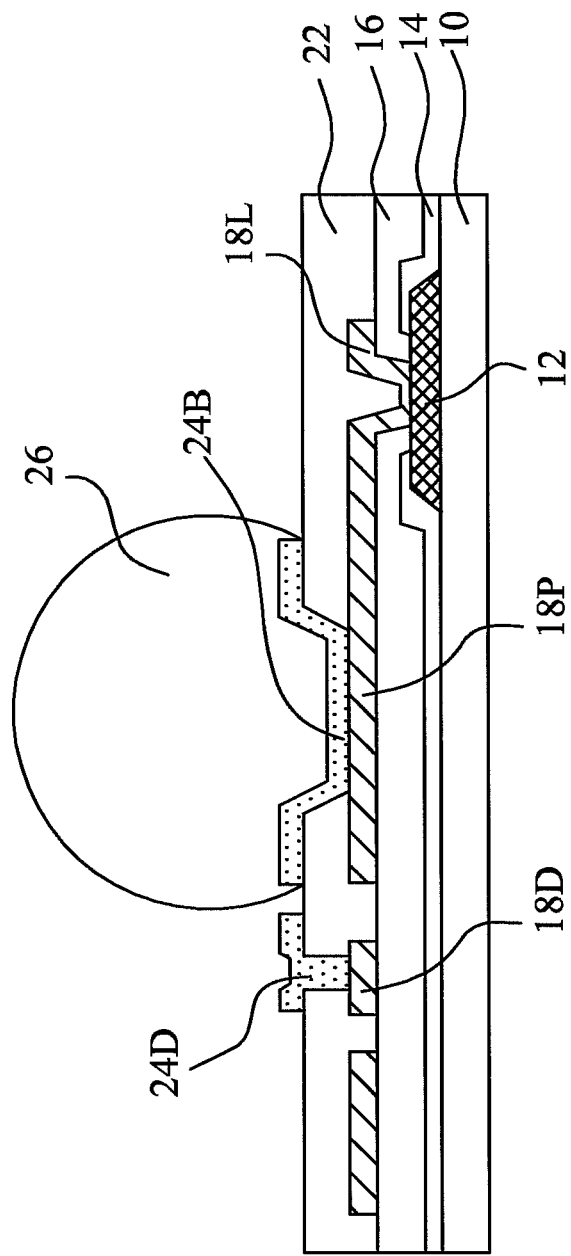

As shown in FIG. 4A, a solder bump 26 is formed on the UBM layer 24B. In one embodiment, the solder bump 26 is formed by attaching a solder ball on the UBM layer 24B and then reflowing the material. In alternative embodiment, the solder bump is formed by plating a solder material and then reflowing the material. The solder bump 26 may include a lead-free pre-solder layer, SnAg, or a solder material including alloys of tin, lead, silver, copper, nickel, bismuth, or combinations thereof. FIG. 4B is a top view of the solder bumps 26 in accordance with an exemplary embodiment. The solder bumps 26 are formed on the UBM layers 24B within the landing pad regions 18P, respectively. A trace 18" formed of the conductive layer 18 of the PPI structure 20 is located between two adjacent interconnect line regions 18L. In an embodiment, the trace 18" has a width W1 greater than 5 μm or greater than 10 μm. In another embodiment, the space S3 between the trace 18" and the adjacent interconnect line regions 18L is greater than 5 μm or greater than 10 μm. In other embodiments, the space S4 between the two adjacent solder bumps 26 is greater than 100 μm, for example greater than 120 μm or 150 μm. Thus, at least one dummy pillar 24D is located adjacent to at least one of the solder bumps 26. In some embodiments, a plurality of dummy pillars 24D is formed adjacent to each solder bump 26. The illustrated solder bump sizes are provided for reference only and are not intended to be actual sizes or actual relative sizes.

A bump structure is therefore completed on a semiconductor device. The presented embodiments provide a dummy structure including the dummy pillar 24D and the dummy region 18D adjacent to the bump structure to enhance the adhesion between the second protective layer 22 and the first protective layer 16. This can improve the strength in the PPI structure 20, and the peeling and cracking of the polymer layer may be reduced and/or eliminated. Accordingly, in packaging assembly processes, joint reliability can be increased and bump fatigue can be reduced.

After the bump formation, for example, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 5:
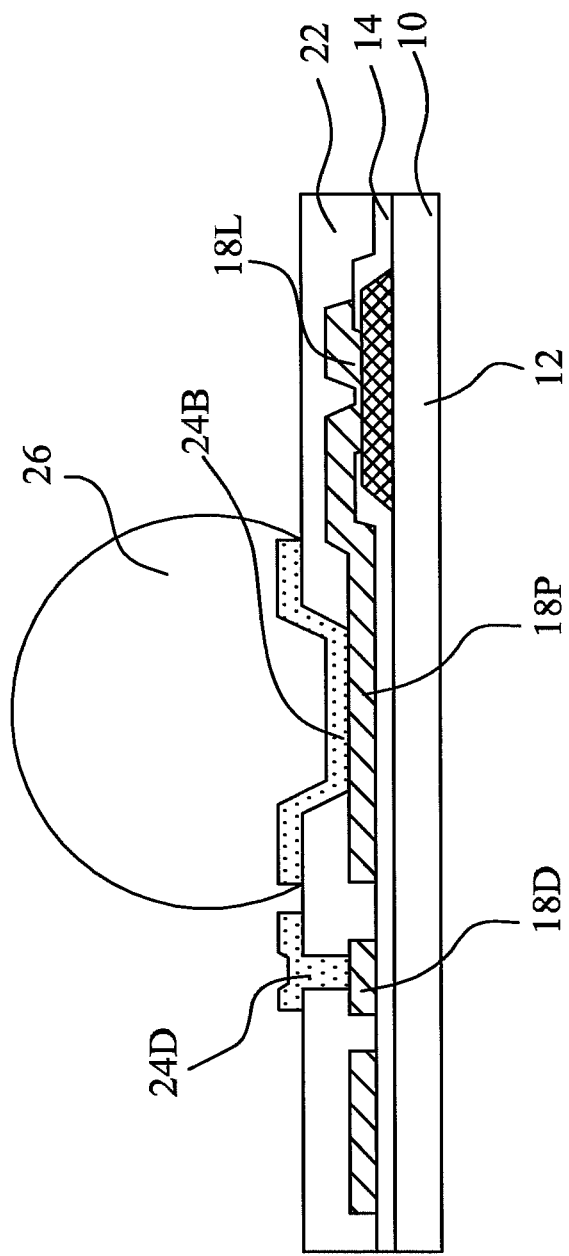
FIG. 5 is a cross-sectional view of a semiconductor device having an alternative PPI structure in accordance with an exemplary embodiment.

FIG. 5 illustrates an exemplary PPI structure in a semiconductor device in accordance with an alternative embodiment. Unless specified otherwise, the reference numerals in this embodiment represents like elements in the embodiment illustrated in FIGS. 1-4.

Compared with the structure shown in FIG. 4A, the alternative structure shown in FIG. 5 is free of the first protective layer 16. The PPI structure 20 is formed on the passivation layer 16, thus the interconnect line region 18L is electrically connected to the conductive pad 12 through the opening in the passivation layer 14.

Figure 6:
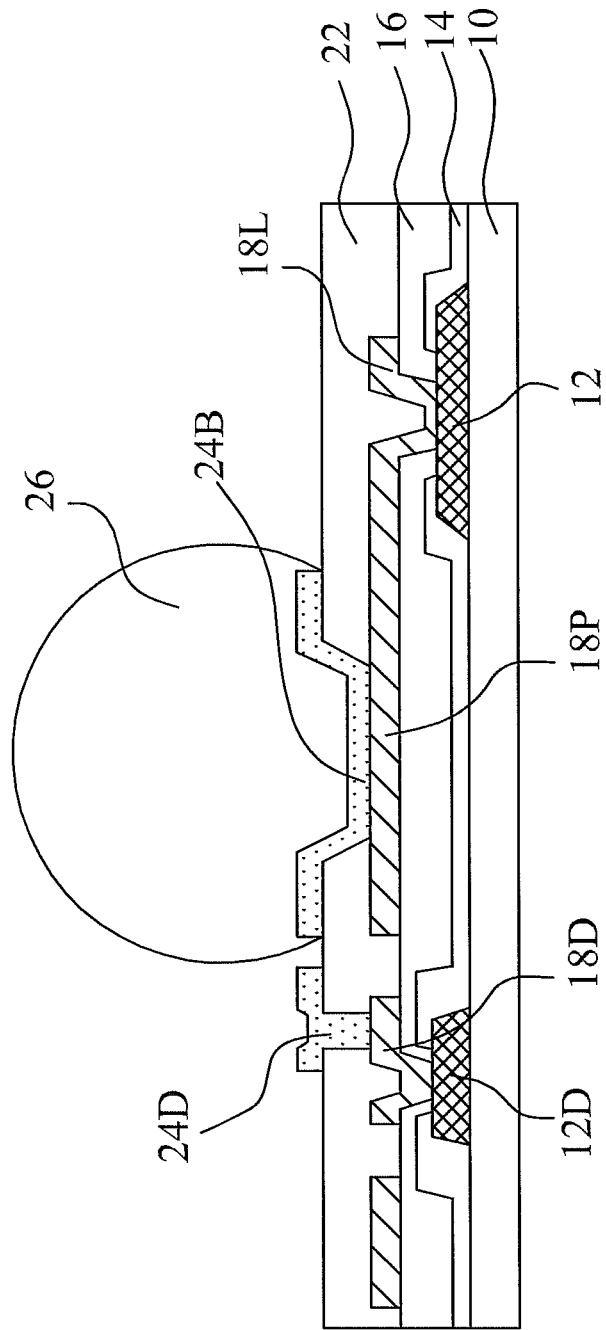
FIG. 6 is a cross-sectional view of a semiconductor device having another alternative PPI structure in accordance with an exemplary embodiment.

FIG. 6 illustrates an exemplary PPI structure in a semiconductor device in accordance with another alternative embodiment. Unless specified otherwise, the reference numerals in this embodiment represents like elements in the embodiment illustrated in FIGS. 1-4.

Compared with the structure shown in FIG. 4A, the alternative structure shown in FIG. 6 further includes a dummy pad 12D formed underlying the dummy region 18D. The dummy pad 12D is electrically separated from the conductive pad 12 and the circuitry formed in the substrate 10. The dummy pad 12D and the conductive pad 12 may be formed simultaneously, and may be formed of a same conductive material. The passivation layer 14 and the first protective layer 16 are formed and patterned to expose a portion of the dummy pad 12D, and thus the dummy region 18D electrically connects the dummy pad 12D. In an embodiment, at least one dummy pad 12D is formed underlying the dummy region 18D adjacent to the landing pad region 18P. In some embodiments, a plurality of dummy pads 12D is formed adjacent to the landing pad region 18D.

Figure 7:
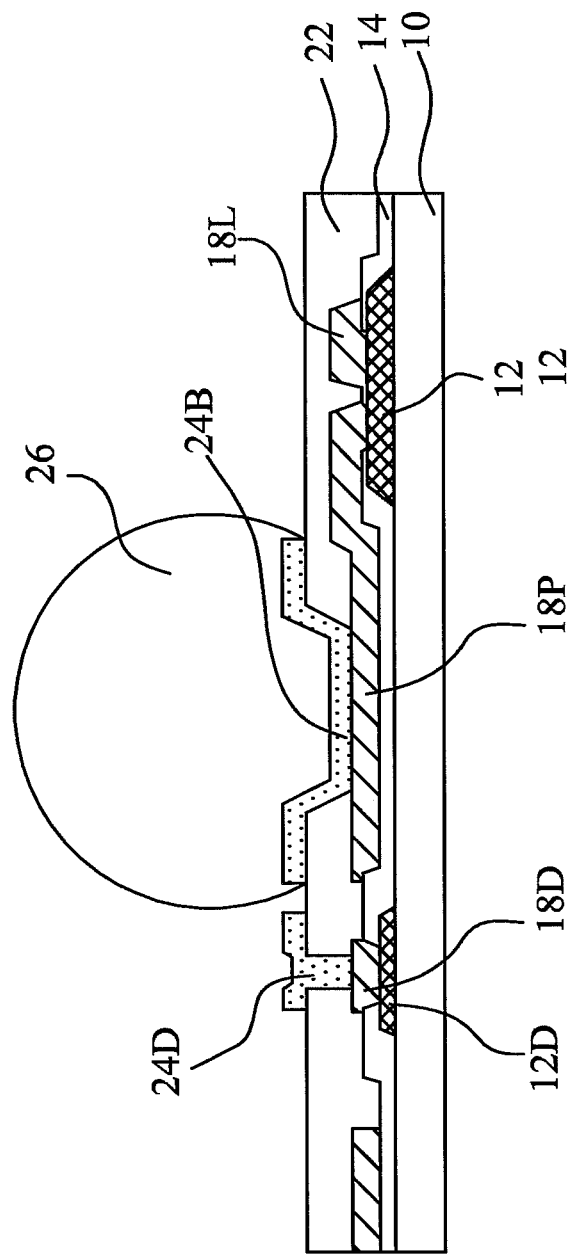
FIG. 7 is a cross-sectional view of a semiconductor device having another alternative PPI structure in accordance with an exemplary embodiment.

FIG. 7 illustrates an exemplary PPI structure in a semiconductor device in accordance with another alternative embodiment. Unless specified otherwise, the reference numerals in this embodiment represents like elements in the embodiment illustrated in FIG. 5.

Compared with the structure shown in FIG. 6, the alternative structure shown in FIG. 7 is free of the first protective layer 16. The PPI structure 20 is formed on the passivation layer 14, thus the interconnect line region 18L is electrically connected to the conductive pad 12 through the opening in the passivation layer 14.

In accordance with one aspect of the exemplary embodiments, a semiconductor device includes a semiconductor substrate, a passivation layer overlying the semiconductor substrate, and an interconnect structure overlying the passivation layer. The interconnect structure includes a landing pad region and a dummy region electrically separated from each other. A protective layer is formed on the interconnect structure and has a first opening exposing a portion of the landing pad region and a second opening exposing a portion of the dummy region. A metal layer is formed on the exposed portion of landing pad region and the exposed portion of the dummy region. A bump is formed on the metal layer overlying the landing pad region.

In accordance with another aspect of the exemplary embodiments, a semiconductor device includes a semiconductor substrate having a conductive pad, a passivation layer formed on the semiconductor substrate and exposing a portion of the conductive pad, and a post-passivation interconnect (PPI) structure overlying the passivation layer. The PPI structure includes a first region electrically connected to the exposed portion of the conductive pad, and a second region electrically separated from the first region. A polymer layer is formed on the PPI structure and has a first opening exposing a portion of the first region of the PPI structure and a second opening exposing a portion of the second region of the PPI structure. An under-bump-metallization (UBM) layer is formed in the first opening of the polymer layer. A metal layer is formed in the second opening of the polymer layer.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
    a semiconductor substrate comprising circuitry and a plurality of metal layers formed between dielectric layers operable to route electrical signals formed therein;
    a passivation layer overlying the semiconductor substrate;
    an interconnect structure overlying and interfacing a top surface of the passivation layer, the interconnect structure comprising a landing pad conductive element and a plurality of dummy conductive elements, wherein the landing pad conductive element and the plurality of dummy conductive elements are electrically separated;
    a protective layer overlying the interconnect structure and comprising a first opening exposing a portion of the landing pad conductive element and a second opening exposing a portion of each of the plurality of dummy conductive elements;
    a metal layer comprising a first portion on a topmost surface of the protective layer and on the exposed portion of the landing pad conductive element and a plurality of second portions on the topmost surface of the protective layer and on the exposed portion of each of the plurality of dummy conductive elements, the plurality of second portions of the metal layer being electrically separated from the semiconductor substrate and from the first portion of the metal layer; and
    a single bump on the first portion of the metal layer overlying the landing pad conductive element;
    wherein each of the plurality of dummy conductive elements adjoins with a respective one of the plurality of second portions of the metal layer to from a plurality of pillars, the plurality of pillars surrounding the single bump in a plan view, and wherein an only bump surrounded by the plurality of pillars is the single bump.

2. The semiconductor device of claim 1, wherein the interconnect structure further includes an interconnect line region coupled to the landing pad conductive element.

3. The semiconductor device of claim 2, wherein the interconnect line region traverses between a first pillar and a second pillar of the plurality of pillars in the plan view.

4. The semiconductor device of claim 1, wherein the metal layer comprises at least one of a titanium layer, a copper layer, or a nickel layer.

5. The semiconductor device of claim 1, wherein the landing pad conductive element and the plurality of dummy conductive elements of the interconnect structure includes a copper layer.

6. The semiconductor device of claim 1, wherein the protective layer comprises a plurality of second openings adjacent to the first opening, and the plurality of second portions of the metal layer fills the plurality of second openings.

7. The semiconductor device of claim 1, wherein the protective layer includes a polymer.

8. The semiconductor device of claim 1, further comprising a conductive pad formed on the semiconductor substrate, wherein the conductive pad is partially covered by the passivation layer, and the conductive pad is electrically connected to the landing pad conductive element of the interconnect structure and the conductive pad has a direct interface with a surface of the landing pad conductive element.

9. The semiconductor device of claim 1, wherein each of the plurality of pillars is a square shape.

10. The semiconductor device of claim 9, wherein each of the plurality of pillars has with a length of at least 5 µm, the length measured in the plan view.

11. The semiconductor device of claim 1, wherein each of the plurality of pillars is spaced from an adjacent one of the plurality of pillars by at least 5 µm.

12. The semiconductor device of claim 11, wherein a distance between one of the plurality of pillars and the first portion of the metal layer is greater than 10 µm.

13. A semiconductor device, comprising:
    a semiconductor substrate comprising circuitry and a plurality of inter-metal dielectric (IMD) layers and associated metal layers formed therein;
    a post-passivation interconnect (PPI) structure having an interconnect line region, a landing pad region and a plurality of dummy regions, wherein the interconnect line region and the landing pad region are contiguous conductive material and each of the plurality of dummy regions is electrically separated from the interconnect line region and the landing pad region;
    an under-bump-metallization (UBM) layer formed on the landing pad region;
    a metal layer formed on each of the plurality of dummy regions of the PPI structure to form a plurality of metal pillars each electrically separated from one another; and
    a single bump on the UBM layer, wherein the plurality of metal pillars each being spaced a same distance from the single bump.

14. The semiconductor device of claim 13, wherein the plurality of metal pillars surrounds the single bump in a plan view.

15. The semiconductor device of claim 13, wherein the metal layer comprises at least one of a titanium layer, a copper layer, or a nickel layer.

16. The semiconductor device of claim 13, further comprising a polymer layer over the interconnect line region.

17. The semiconductor device of claim 16, wherein the metal pillars extend through the polymer layer.

18. A semiconductor device, comprising:
- a semiconductor substrate comprising circuitry and a plurality of metal layers formed between dielectric layers operable to route electrical signals formed therein;
- a passivation layer overlying the semiconductor substrate;
- an interconnect structure overlying and interfacing a top surface of the passivation layer, the interconnect structure comprising a first landing pad conductive element and a first plurality of dummy conductive elements electrically separated from each other and electrically separated from the first landing pad conductive element;
- a polymer layer disposed over the interconnect structure;
- a first plurality of metal pillars each disposed in an opening in the polymer layer, wherein the first plurality of metal pillars are electrically separated from each other and electrically separated from the first landing pad conductive element; and
- a first bump electrically connected to the first landing pad conductive element, wherein the first plurality of metal pillars surrounds the first bump in a plan view.

19. The semiconductor device of claim 18, further comprising: a second bump having a second plurality of metal pillars surrounding the second bump in the plan view.

20. The semiconductor device of claim 18, wherein the first plurality of metal pillars surrounding the first bump are each spaced a first distance from the first bump.

\* \* \* \* \*